US008209590B2

(12) United States Patent
Shen et al.

(10) Patent No.: US 8,209,590 B2
(45) Date of Patent: Jun. 26, 2012

(54) HEADER ENCODING/DECODING

(75) Inventors: Ba-Zhong Shen, Irvine, CA (US); Jason A. Trachewsky, Menlo Park, CA (US)

(73) Assignee: Broadcom Corporation, Irvine, CA (US)

( * ) Notice: Subject to any disclaimer, the term of this patent is extended or adjusted under 35 U.S.C. 154(b) by 441 days.

(21) Appl. No.: 12/612,640

(22) Filed: Nov. 4, 2009

(65) Prior Publication Data

US 2010/0115375 A1  May 6, 2010

Related U.S. Application Data

(60) Provisional application No. 61/111,685, filed on Nov. 5, 2008, provisional application No. 61/156,857, filed on Mar. 2, 2009, provisional application No. 61/235,732, filed on Aug. 21, 2009.

(51) Int. Cl.
*G06F 11/00* (2006.01)
(52) U.S. Cl. ......... 714/794; 714/751; 714/752; 714/758
(58) Field of Classification Search .................. 714/751, 714/758, 794
See application file for complete search history.

(56) References Cited

U.S. PATENT DOCUMENTS

| | | | | |
|---|---|---|---|---|
| 7,600,172 | B2 * | 10/2009 | Berens et al. | 714/751 |
| 7,900,127 | B2 * | 3/2011 | Shen et al. | 714/804 |
| 2010/0088568 | A1 * | 4/2010 | Larsson | 714/751 |
| 2011/0107175 | A1 * | 5/2011 | Shen et al. | 714/752 |

OTHER PUBLICATIONS

R. Gallager, Low-Density Parity-Check Codes, Cambridge, MA: MIT Press, 1963.
R. G. Gallager, "Low density parity check codes," IRE Trans. Info. Theory, vol. IT-8, Jan. 1962, pp. 21-28.
M. G. Luby, M. Mitzenmacher, M. A. Shokrollahi, D. A. Spielman, and V. Stemann, "Practical Loss-Resilient Codes," Proc. 29th Symp. on Theory of Computing, 1997, pp. 150-159.
T. J. Richardson and R. L. Urbanke, "The capacity of low-density parity-check code under message-passing decoding," IEEE Trans. Inform. Theory, vol. 47, No. 2, Feb. 2001, pp. 599-618.

* cited by examiner

*Primary Examiner* — Charles Ehne
(74) *Attorney, Agent, or Firm* — Garlick & Markison; Shayne X. Short

(57) ABSTRACT

In a communication device that is operative to perform decoding, a log-likelihood ratio (LLR) circuitry operates to calculate LLRs corresponding to every bit location within a received bit sequence. This received bit sequence may include a header and a data portion (both of which may be included within a frame that also includes a preamble). The header is composed of information bits, a duplicate of those information bits (such as may be generated in accordance with repetition encoding), and redundancy bits. The header includes information corresponding to frame or data including frame length, a code type by which the data are encoded, a code rate by which the data are encoded, and a modulation by which symbols of the data are modulated. Once the header has been decoded, then the data corresponding thereto is decoded by a block decoder circuitry to make estimates of that data.

20 Claims, 14 Drawing Sheets

Fig. 4A (variable node update)

Fig. 4B (check node update)

HEADER ENCODING/DECODING

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Applications which are hereby incorporated herein by reference in their entirety and made part of the present U.S. Utility patent application for all purposes:

1. U.S. Provisional Application Ser. No. 61/111,685, entitled "60 GHz single carrier modulation," filed Nov. 5, 2008.

2. U.S. Provisional Application Ser. No. 61/156,857, entitled "Header encoding/decoding," filed Mar. 2, 2009.

3. U.S. Provisional Application Ser. No. 61/235,732, entitled "Header encoding for single carrier (SC) and/or orthogonal frequency division multiplexing (OFDM) using shortening, puncturing, and/or repetition," filed Aug. 21, 2009.

INCORPORATION BY REFERENCE

The following U.S. Utility patent applications are hereby incorporated herein by reference in their entirety and are made part of the present U.S. Utility patent application for all purposes:

1. U.S. Utility application Ser. No. 12/605,088, entitled "Baseband unit having bit repetitive encoded/decoding," filed Oct. 23, 2009, pending, which claims priority pursuant to 35 U.S.C. §119(e) to the following U.S. Provisional Patent Application which is hereby incorporated herein by reference in its entirety and made part of the present U.S. Utility patent application for all purposes:
   a. U.S. Provisional Application Ser. No. 61/111,685, entitled "60 GHz single carrier modulation," filed Nov. 5, 2008.

2. U.S. Utility application Ser. No. 12/612,648, entitled "Header encoding for single carrier (SC) and/or orthogonal frequency division multiplexing (OFDM) using shortening, puncturing, and/or repetition," filed concurrently on Nov. 4, 2009, pending, which claims priority pursuant to 35 U.S.C. §119(e) to the following U.S. Provisional Patent Applications which are hereby incorporated herein by reference in their entirety and made part of the present U.S. Utility Patent Application for all purposes:
   a. U.S. Provisional Application Ser. No. 61/111,685, entitled "60 GHz single carrier modulation," filed Nov. 5, 2008.
   b. U.S. Provisional Application Ser. No. 61/156,857, entitled "Header encoding/decoding," filed Mar. 2, 2009.
   c. U.S. Provisional Application Ser. No. 61/235,732, entitled "Header encoding for single carrier (SC) and/or orthogonal frequency division multiplexing (OFDM) using shortening, puncturing, and/or repetition," filed Aug. 21, 2009.

BACKGROUND OF THE INVENTION

1. Technical Field of the Invention

The invention relates generally to communication devices that are implemented to perform encoding and decoding of information; and, more particularly, it relates to communication devices that are implemented to perform header encoding and decoding of information within communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
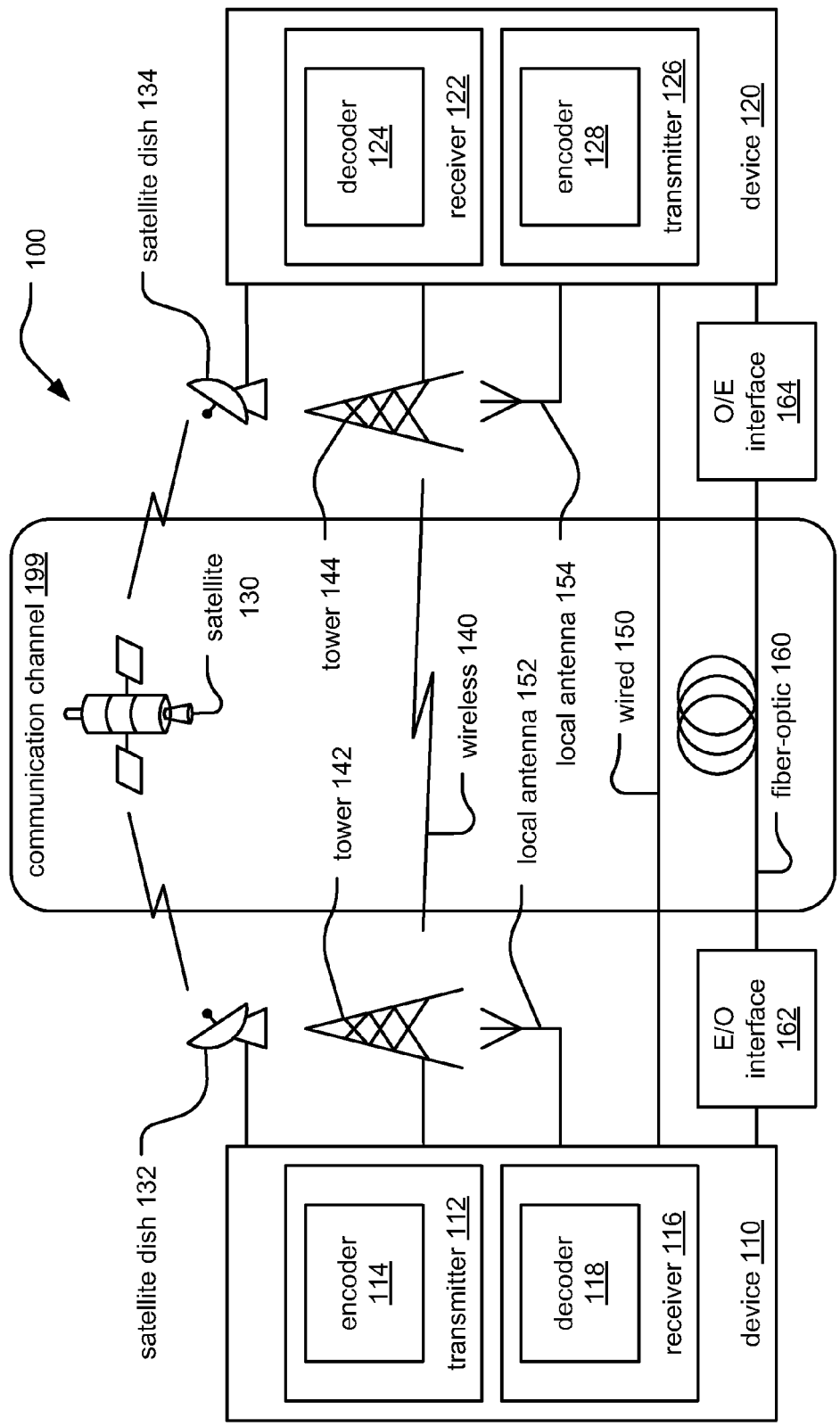
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
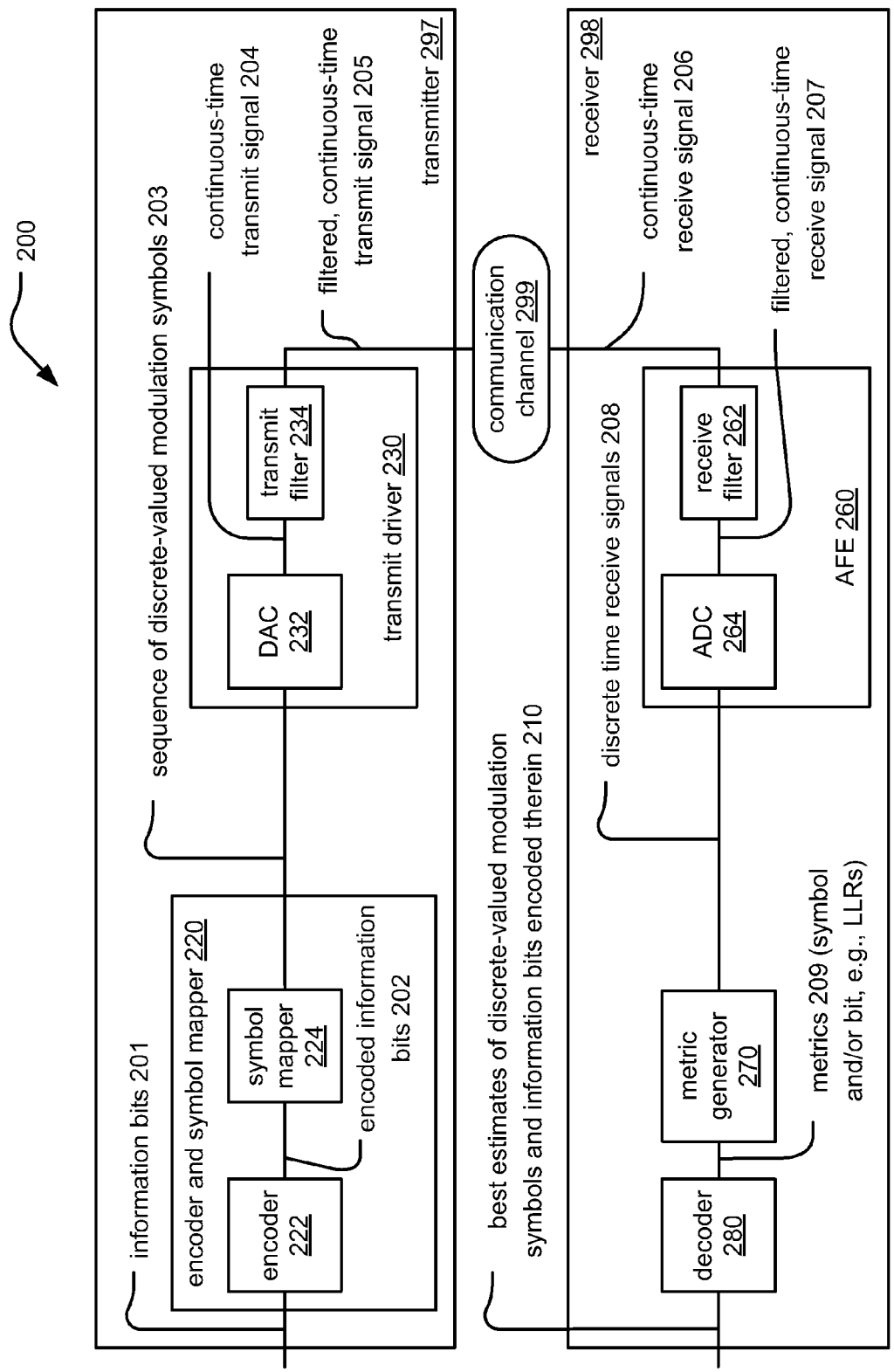

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. A general description of LDPC codes is provided below as well.

Figure 3:
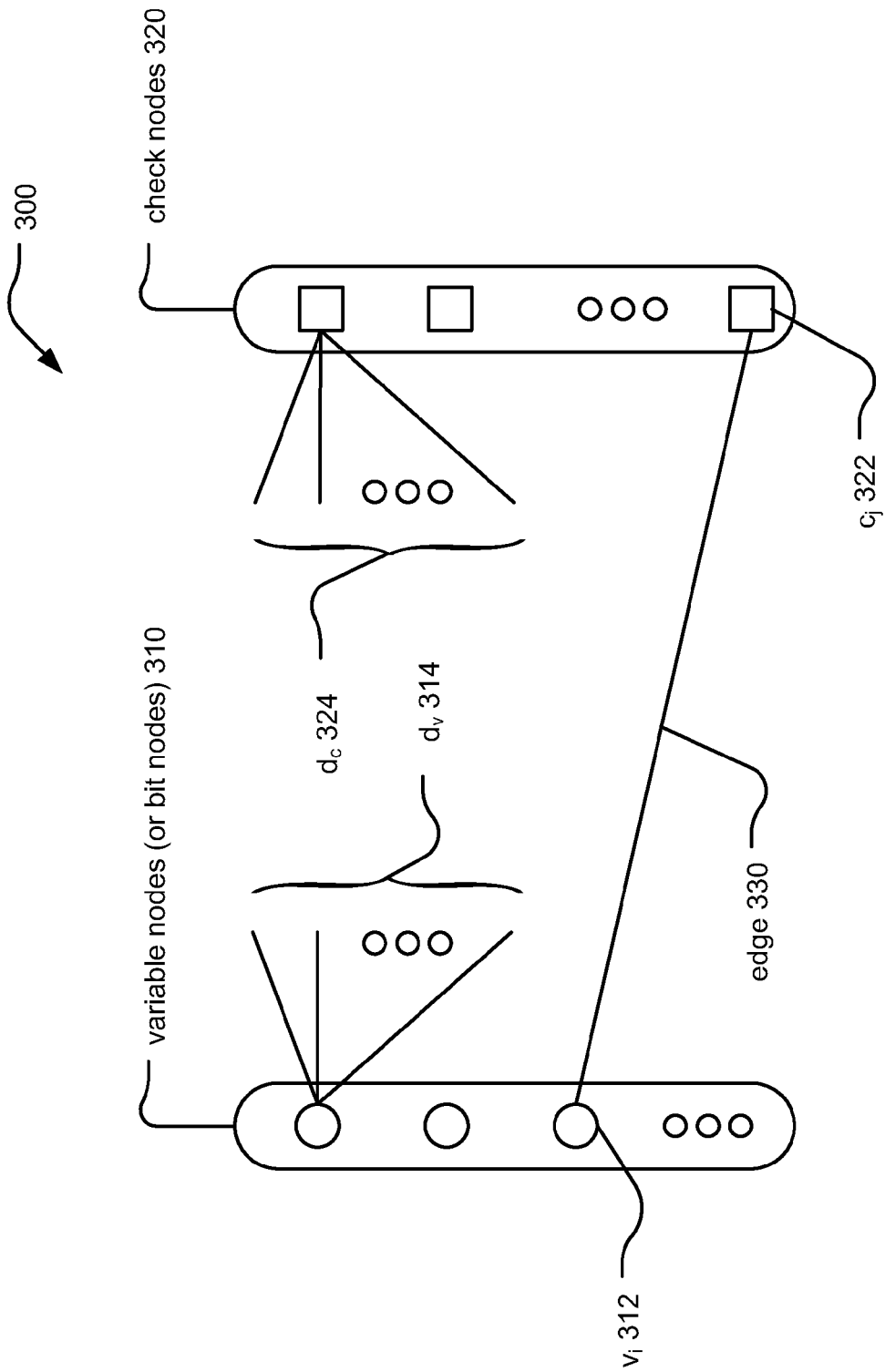
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," IRE Trans. Info. Theory, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 (or sometimes referred to as a Tanner graph 300) of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 330 is specifically shown as connecting from the bit node, $v_i$ 312, to the check node, $c_j$ 322. This number of edges (shown as 314) may be referred to as the degree of a variable node i. Analogously, every check node of the M check nodes 320 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e = (i, j)$. However, on the other hand, given an edge $e = (i, j)$, the nodes of the edge may alternatively be denoted as by $e = (v(e), c(e))$ (or $e = (b(e), c(e))$). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i) = \{e|v(e)=i\}$ (or by $E_b(i) = \{e|b(e)=i\}$); these edges are referred to as bit edges, and the messages corresponding to these bit edges are referred to as bit edge messages.

Given a check node $C_1$, one may define the set of edges emitting from the node $c_j$ by $E_c(j) = \{e|c(e)=j\}$; these edges are referred to as check edges, and the messages corresponding to these check edges are referred to as check edge messages. Continuing on, the derivative result will be $|E_v(i)| = d_v$ (or $|E_b(i)| = d_b$) and $|E_c(j)| = d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

Figure 4:
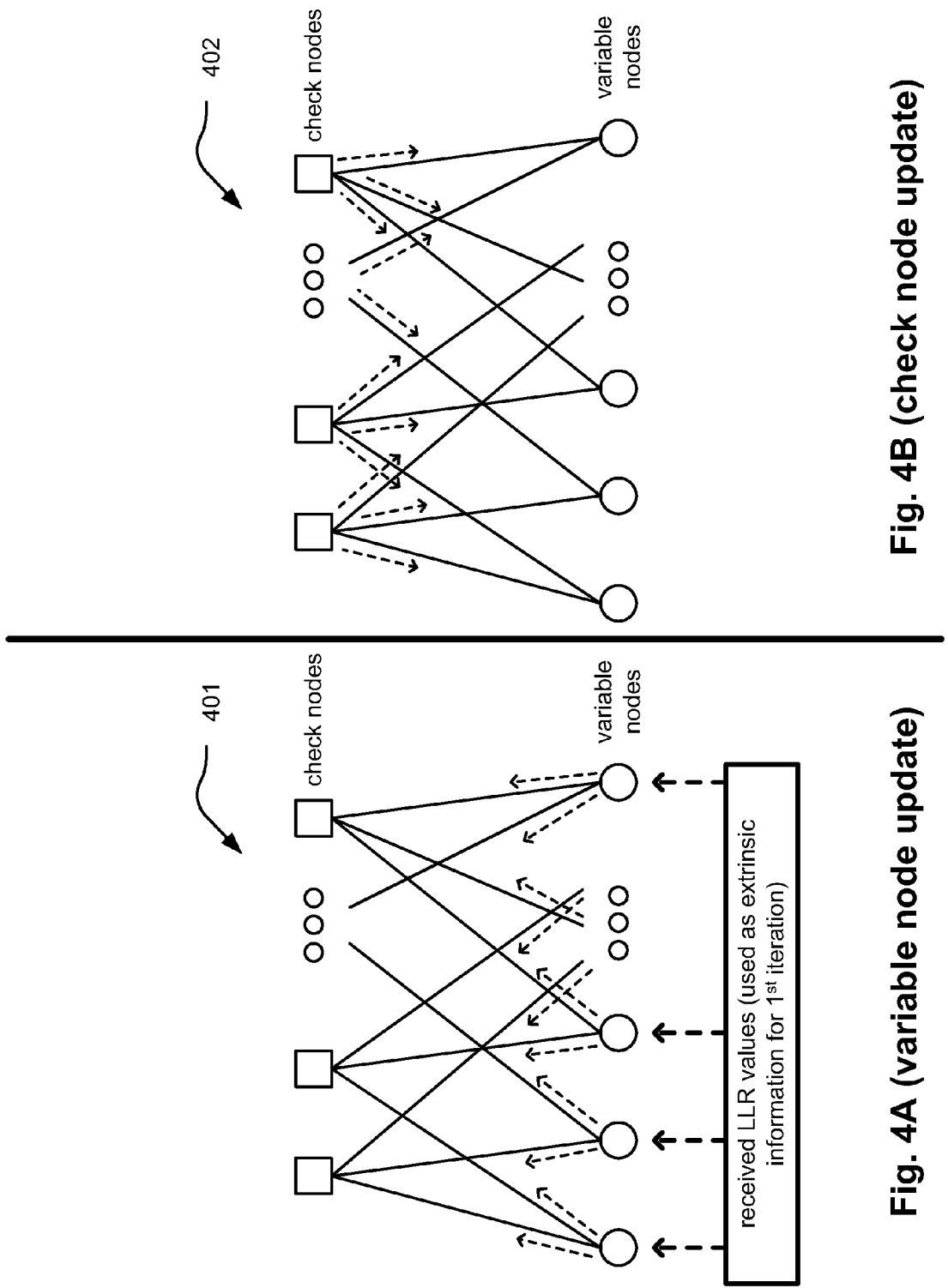
FIG. 4A illustrates an embodiment of variable node update with reference to an LDPC code bipartite graph.
FIG. 4B illustrates an embodiment of check node update with reference to an LDPC code bipartite graph.

FIG. 4A illustrates an embodiment 401 of variable node update with reference to an LDPC code bipartite graph. FIG. 4B illustrates an embodiment 402 of check node update with reference to an LDPC code bipartite graph. These two diagrams may be considered in conjunction with one another.

A signal received from a communication channel undergoes appropriate demodulation (e.g., processing within an analog front end including digital sampling, filtering, gain adjustment, etc.) to generate a received bit sequence. Then, log-likelihood ratios (LLRs) are calculated for each bit location within the received bit sequence. These LLRs correspond respectively to bit nodes of the LDPC code and its corresponding LDPC bipartite graph.

During initialization, the LLRs are employed for the bit edge messages (e.g., extrinsic information) for each edge emanating from each respective variable node. Thereafter, check node processing or check node updating is performed using the original bit edge messages (e.g., the calculated LLRs). These updated check edge messages are then employed to perform bit node processing or bit node updating to update the variable node soft information for use in the next decoding iteration. The variable node soft information is then used to calculate the variable node edge messages (extrinsic information) for this next decoding iteration.

These variable node edge messages are then used in accordance with check node processing or check node updating to calculate updated check edge messages. Subsequently, these most recently updated check edge messages are then employed to perform bit node processing or bit node updating to update the variable node soft information once again.

After a final decoding iteration, which may be determined based on some parameter (e.g., a predetermined number of decoding iterations or when all syndromes of the LDPC code equal zero), the last calculated variable node soft information may undergo hard limiting (e.g., in a slicer) to generate estimates of the bits encoded within the received signal.

Figure 5:
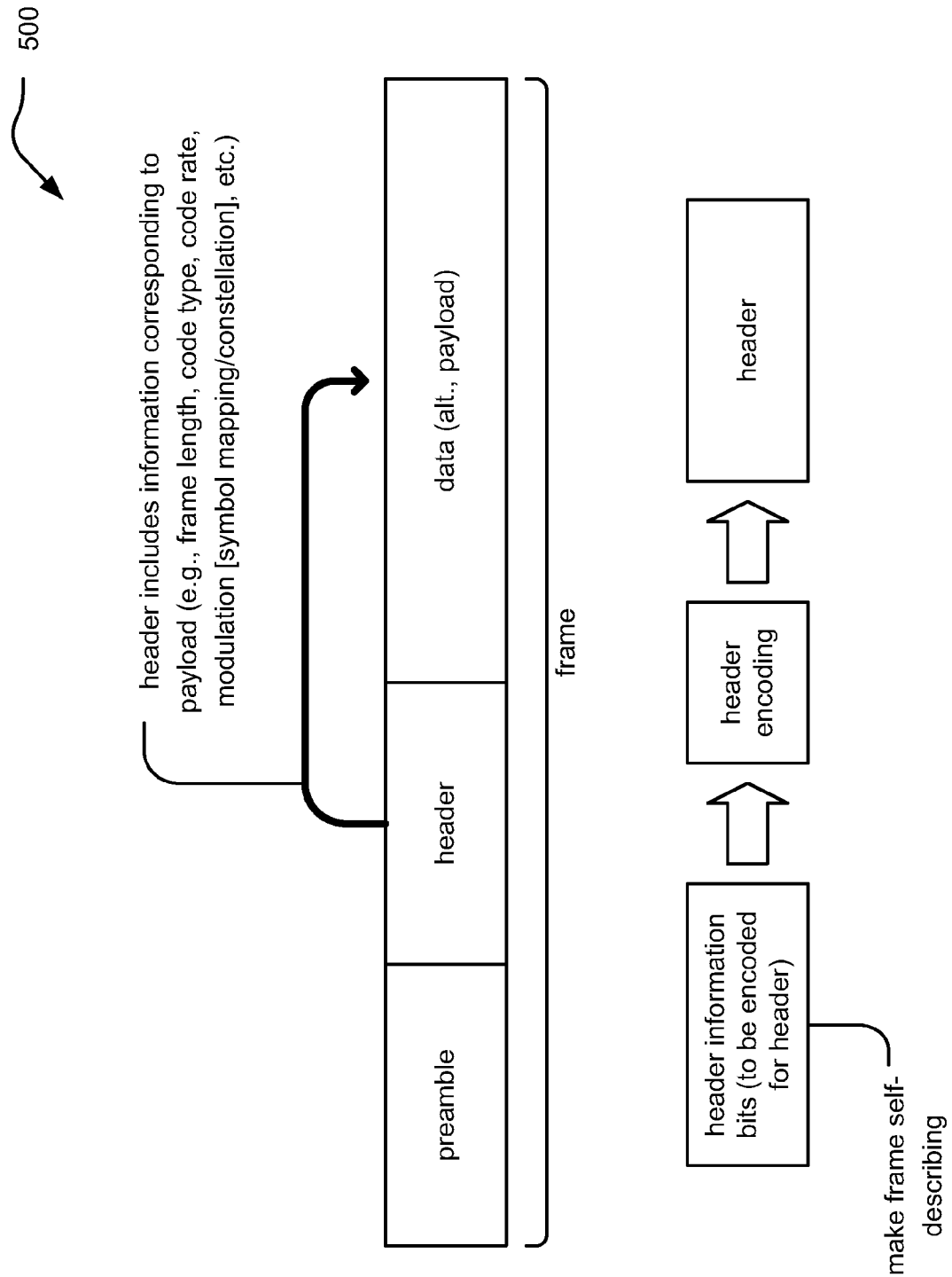
FIG. 5 illustrates an embodiment of a frame showing the respective portions of preamble, header, and data therein.

FIG. 5 illustrates an embodiment 500 of a frame showing the respective portions of preamble, header, and data therein. A frame, such as a physical layer frame, that gets transmitted from a communication device into a communication channel may have the form as described in this diagram. While many of the frames described herein are described with reference to a digital format, it is of course noted that a digital signal may undergo a variety of processing (e.g., digital to analog conversion, frequency conversion, filtering [analog or digital], scaling, etc.) to generate a continuous time signal that is launched into the communication channel.

In this diagram, the frame includes a preamble, a header, and data (alternatively referred to as the payload portion of the frame). The data generally includes the actually information to be transmitted from a first location to a second location.

The preamble includes a set of sequences (which may be repetitive) for a variety of applications including: initial frame/burst detection, carrier frequency acquisition, automatic gain control (AGC), timing recovery, channel estimation, noise/interference estimation, and/or information employed for other applications.

In one design, the preamble may be the same for both the single carrier (SC) modulation and orthogonal frequency division multiplexing (OFDM) PHY modes of operation. The preamble may be encoded as a set of Golay sequences (or other sequences with good correlation properties) encoded using BPSK followed by $\pm\pi/2$ (e.g., $\pm 90°$) rotation per symbol.

Header information bits undergo encoding (e.g., using the same type of code, or variant of the same base code, as is employed to encode the data) to form the "header". The header may be encoded/modulated using either SC modulation or OFDM. OFDM uses a certain number of data sub-carriers (e.g., 336) and a certain number of pilots/fixed sub-carriers (e.g., 16). In comparison, SC modulation may use binary phase shift keying (BPSK) modulation with +/−p/2 rotation per symbol. The header information bits (that undergo encoding to form the header) include all information required to make a frame self-describing. For example, the include information corresponding to modulation/coding set for the data field (e.g., code rate, code type, constellation/mapping, etc.), the length of the data in octets or time duration, and/or any additional training information (such as may be employed in accordance with beamforming in certain wireless contexts such as multiple input multiple output (MIMO) communication systems). The data field may be modulated using either SC modulation or OFDM using any of a variety of possible constellations and mappings.

A novel means is presented herein for generating the header that allows for providing a flexible header bits size for both SC (single carrier) and orthogonal frequency division multiplexing (OFDM) physical layer (PHY). The final output size of the header may be targeted to be a predetermined size (e.g., generally X bits, or specific values such as 448 bits for a SC PHY and 672 bits for an OFDM PHY. The OFDM header and SC header encodings are aligned (e.g., use the rate ¾ of size 672 LDPC code as base code for both models).

Figure 6:
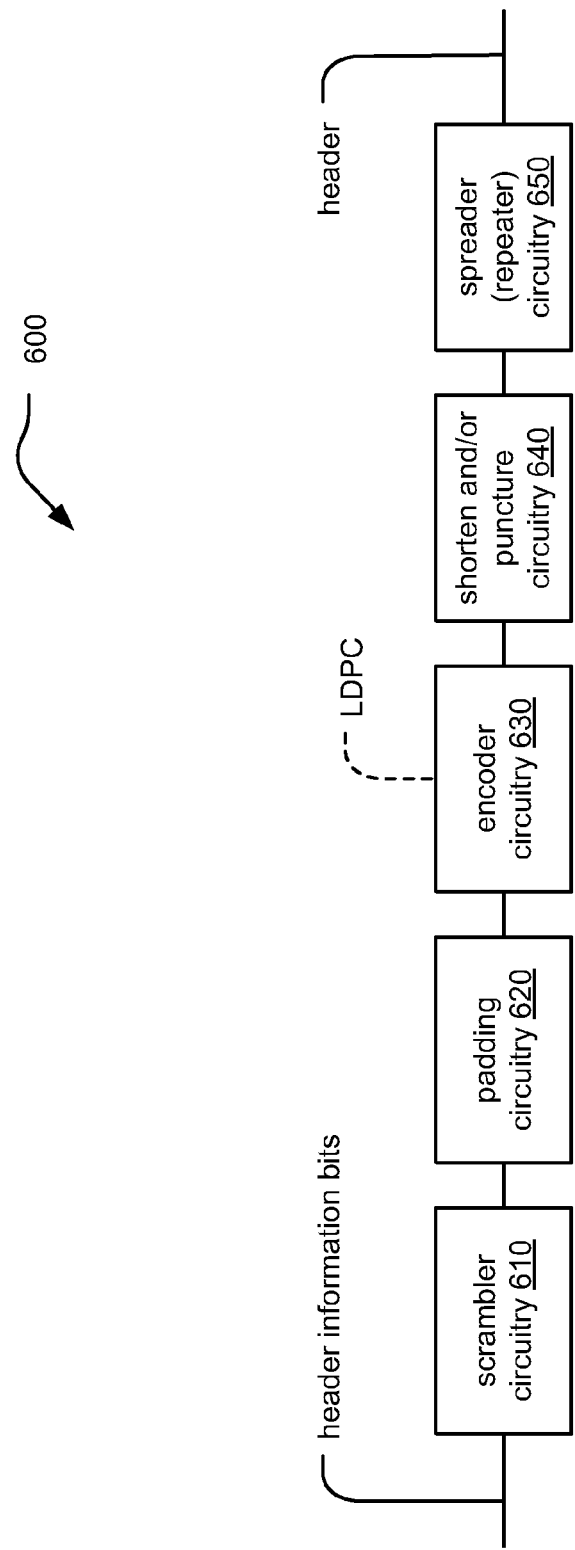
FIG. 6 illustrates an embodiment of an apparatus that is operative to process header information bits thereby generating a header.

FIG. 6 illustrates an embodiment of an apparatus 600 that is operative to process header information bits thereby generating a header. Header information bits (e.g., those bits that includes all appropriate information to make the frame self-describing—such as those parameter described above) may be provided to a scrambler circuitry 610. After being scrambled in the scrambler circuitry 610 (using some scrambling pattern—one pattern/option of which may involve no scrambling whatsoever), these bits are then provided to a padding circuitry 620 that is operative to place at least one pad bit (e.g., a 0-valued bit) therein. The placement of where the at least one pad bit is emplaced within the bits provided to the padding circuitry 620 may be varied in different embodiments (e.g., at beginning, at end, interspersed throughout, etc.).

An encoder circuitry 630 operates by encoding padded bit block (output from the padding circuitry 620) thereby generating coded bits. Any of a variety of types of codes (e.g., an LDPC code) may be employed by the encoder circuitry 630. A shorten and/or puncture circuitry 640 may operate on the coded bits by shortening coded bits (e.g., removing padded bits) thereby generating shortened coded bits. The shortened and/or puncture circuitry 640 may also operate by puncturing at least one bit from the shortened coded bits thereby generating punctured bits. These punctured bits are passed to a spreader (repeater) 650 that is operative to perform spreading (e.g., combining, repeating, etc.) the punctured bits thereby generating a header to be emplaced within a frame to be transmitted from a communication device via a communication channel.

Figure 7:
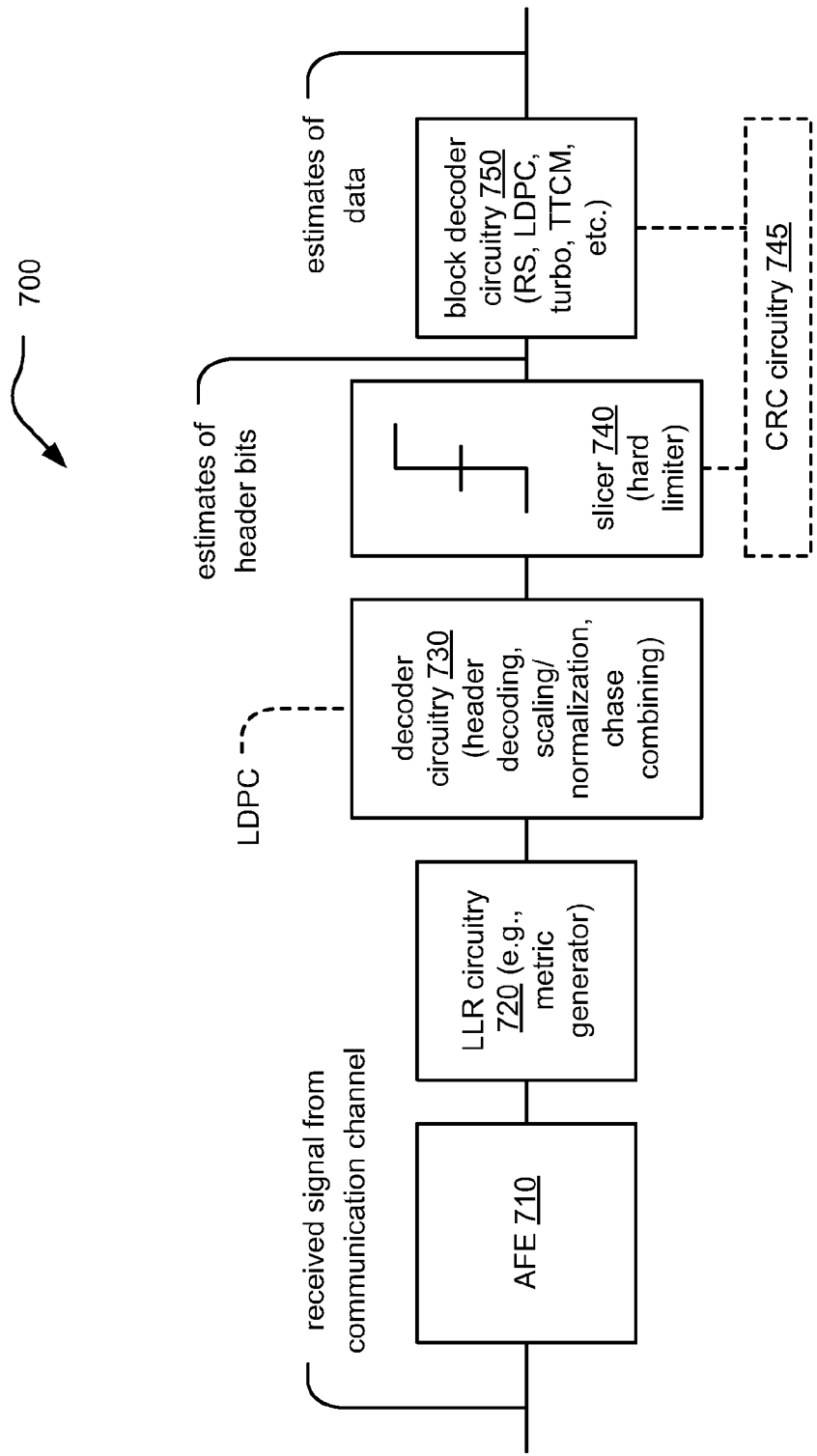
FIG. 7 illustrates an embodiment of an apparatus that is operative to process a received signal to extract header information bits there from for use in decoding corresponding data.

FIG. 7 illustrates an embodiment of an apparatus 700 that is operative to process a received signal to extract header information bits there from for use in decoding corresponding data. A signal received from a communication channel is provided to an analog front end (AFE) 710. The AFE 710 is operative to perform a variety of operations including digital sampling, scaling (e.g., gain adjustment), filtering (digital and/or analog), frequency conversion, etc.) in accordance with generating a digital signal (e.g., a baseband signal).

This digital signal may be viewed as being a received bit sequence that is provided to a log-likelihood ratio (LLR) circuitry 720 that is operative to calculate LLRs corresponding to each respective bit location of a received bit sequence. In some embodiments, an LLR circuitry is implemented as a metric generator. These LLRs are then provided to an LDPC (Low Density Parity Check) decoder circuitry 730 that is operative to perform a number of operations. The LDPC decoder circuitry is operative to perform header decoding to decode the header of a frame so that the appropriate parameters that describe the related data (of the frame) may be extracted for use in decoding. For example, the received bit sequence may be viewed as being a header of a frame that includes the header and data (and may also include a preamble as shown with respect to a previous diagram/embodiment). The bit estimates that eventually get made based on decoding the header include information corresponding to the frame or data including frame length, a code type by which the data are encoded, a code rate by which the data are encoded, and a modulation by which symbols of the data are modulated.

In accordance with decoding the header, the LDPC decoder circuitry 730 is operative to employ the LLRs as a first group of variable node edge messages in accordance with a first decoding iteration to generate a first group of variable node soft information values. Then, the LDPC decoder circuitry 730 is operative to perform chase combining of a first subset of the first group of variable node soft information values with a second subset of the first group of variable node soft information values thereby generating a modified first group of variable node soft information values.

The LDPC decoder circuitry 730 is then operative to employ the modified first group of variable node soft information values to calculate a second group of variable node edge messages, and the LDPC decoder circuitry 730 is operative to employ the second group of variable node edge messages in accordance with a second decoding iteration to generate a second group of variable node soft information values. The LDPC decoder circuitry 730 is operative to perform chase combining of a first subset of the second group of variable node soft information values with a second subset of the second group of variable node soft information values thereby generating a modified second group of variable node soft information values.

A slicer 740 (alternatively, referred to as a hard limiter) is then operative to employ the modified second group of variable node soft information values to make bit estimates corresponding to the received bit sequence.

Once the estimates of the header bits are made, they provide the appropriate information to a block decoder circuitry 750 that is operative to decode the data of the frame based on the information corresponding to the frame or data to make bit estimates corresponding to the data of the frame. The block decoder circuitry 750 may be any type of decoder circuitry includes a Reed-Solomon (RS) decoder circuitry, at least one additional LDPC decoder circuitry, a turbo code decoder circuitry, or a Turbo Trellis Coded Modulation (TTCM) decoder circuitry, or any other type of decoder circuitry. In other words, any desired type of error correction code (ECC) may be employed to encode the data portion of the frame, regardless of the use of an LDPC (Low Density Parity Check) code being used to encode the header information bits.

In addition, a cyclic redundancy check (CRC) circuitry 745 may be implemented to process the bit estimates to determine if the bit estimates pass CRC. For example, if the bit estimates corresponding to the respective bit locations in each of the group of information bits and the duplicate of the group of information bits pass CRC, then the CRC circuitry 745 is operative to output either one (e.g., either the bit estimates corresponding to the respective bit locations in the group of information bits or the estimates corresponding to the duplicate of the group of information bits). Alternatively, if neither the bit estimates corresponding to the respective bit locations in each of the group of information bits nor the duplicate of the group of information bits pass CRC, then the CRC circuitry 745 indicates decoding failure and the apparatus 700 is operative to request a re-transmission of the received bit sequence from another apparatus from which the received bit sequence was originally sent.

Figure 8:
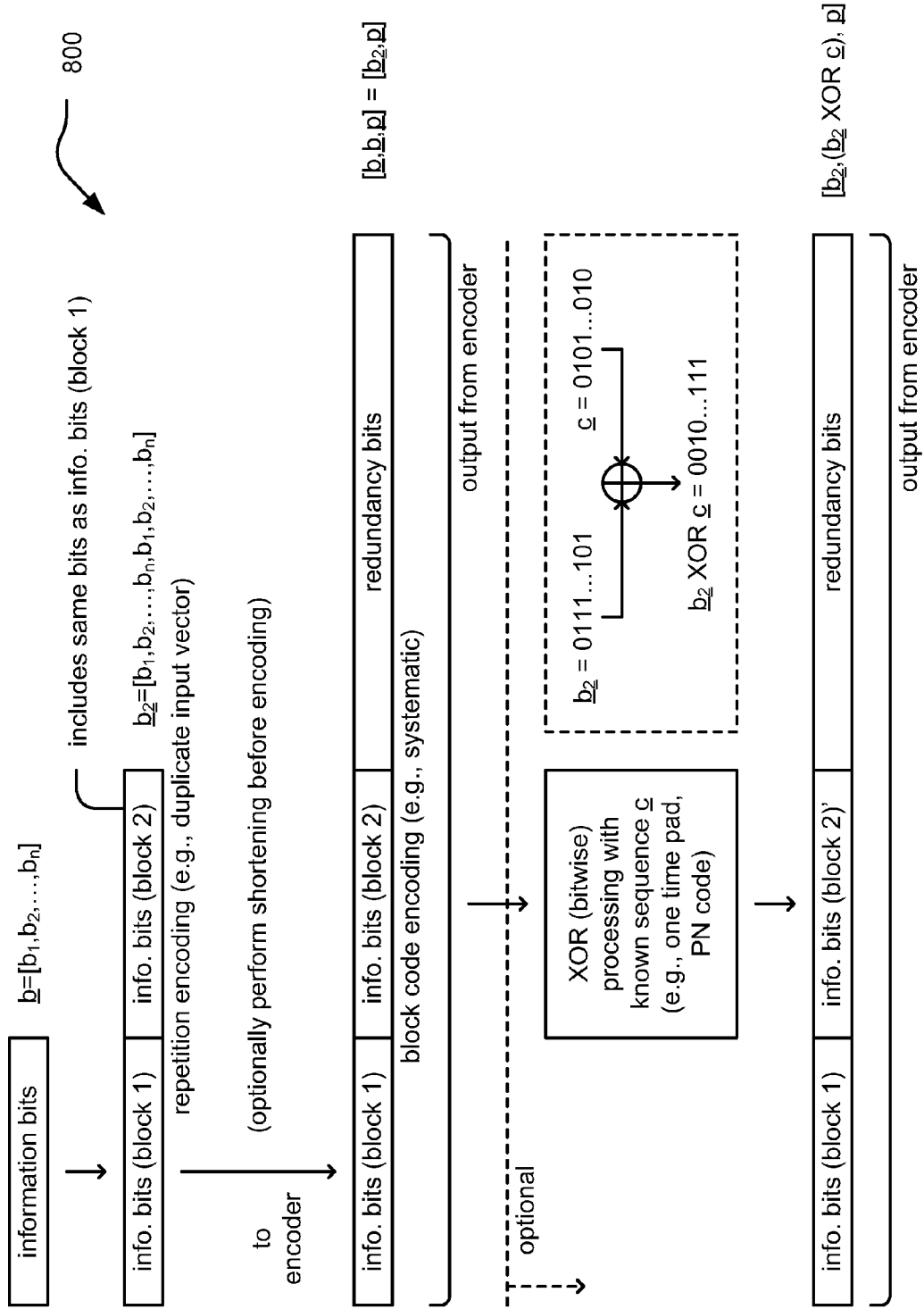
FIG. 8 illustrates an embodiment of repetition encoding with optional one-time pad encoding.

FIG. 8 illustrates an embodiment of repetition encoding with optional one-time pad encoding. A received bit sequence (e.g., a group of N input bits) is to undergo encoding. For example, considering a need to encode N input bits (a bit vector $\underline{b}=[b_1, b_2, \ldots, b_N]$) such that 8×N output bits are produced (i.e., with a r=⅛ effective code rate).

To effectuate repetition encoding, the N bits are duplicated to produce 2 blocks of N bits (i.e., an original and a duplicate). The resulting vector is therefore:

$$\underline{b_2}=[\underline{b}, \underline{b}]=[b_1, b_2, \ldots, b_N, b_1, b_2, \ldots, b_N].$$

The vector $b_2$ of 2×N bits is then passed into an encoder that performs encoding in accordance with a block code.

The block code may any one a variety of types of error correction code (ECC) codes, including an LDPC (Low Density Parity Check) code. In one embodiment, the block code rate is r=¼. In certain embodiments, the codeword may be shortened as well. For example, consider an LDPC code such as LDPC(672,336), r=½ [i.e., having a block size of 672 and encoding 336 information bits].

This LDPC code may be shortened to LDPC(448,112) [i.e., having a block size of 448 and encoding 112 information bits]; this is one third the number of information bits that would be encoded in accordance with the LDPC(672,336), r=½ code. In accordance with shortening, 112 information bits would then be input, and the remaining 224 bits would be all 0s (e.g., 0 valued its located either at end, beginning, or interspersed among the block in accordance with in some predetermined or adaptively determined manner). If such shortening were performed, then the resulting LDPC code rate is ¼.

If the block code is systematic (i.e., information bits are passed straight through with a separate block of redundancy bits), after the resulting vector, $\underline{b_2}=[\underline{b}, \underline{b}]=[b_1, b_2, \ldots, b_N, b_1, b_2, \ldots, b_N]$, undergoes encoding in accordance with such a systematic code, then the generated sequence that is output there from is $[\underline{b}, \underline{b}, \underline{p}]=[\underline{b_2}, \underline{p}]$, where the vector, $\underline{p}$, includes the parity bits generated in accordance with the systematic code.

Also, if the block code is systematic (i.e., where the information bits are passed straight through with a separate block of redundancy bits), the second block of N bits may optionally be XOR'ed with a fixed, known (by transmitter and receiver) sequence of N bits, c, which may be a PN (pseudo-random noise sequence in some embodiments). If this is performed, then the output is [b, (b XOR c), p], where p is a length of 6×N redundancy bit vector, and the "XOR" processing is the bitwise XOR of the bits in the input vectors.

It is noted that this optional XOR processing may be viewed as a "one-time pad" sequence that is operative to mitigate spectral lines in the modulated output due to repeated bits. Again, this diagram shows a r=⅛ effective code rate.

Figure 9:
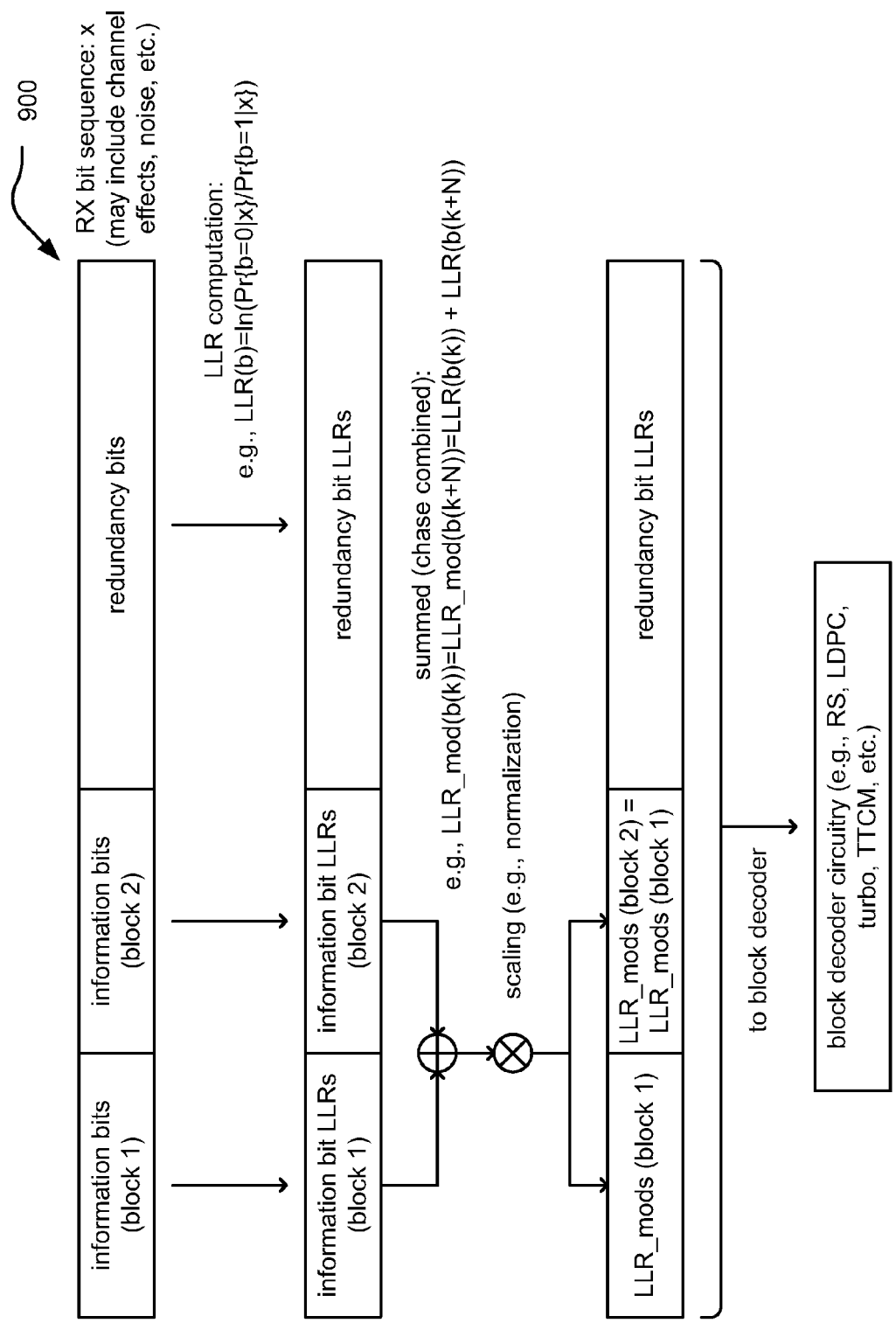
FIG. 9 illustrates an embodiment of chase combining of log-likelihood ratios (LLRs) at a receiver end of a communication channel.

FIG. 9 illustrates an embodiment of chase combining of log-likelihood ratios (LLRs) at a receiver end of a communication channel. A signal received from a communication channel undergoes appropriate demodulation (e.g., processing within an analog front end including digital sampling, filtering, gain adjustment, etc.) to generate a received bit sequence. Then, LLRs are calculated for each bit location within the received bit sequence.

These LLRs of any bit encoded in accordance with a binary phase shift keying (BPSK) modulation (or alternatively referred to as a π/2-BPSK) given a soft equalizer output x and additive white Gaussian noise (AWGN) impairment is $2*x/\sigma^2$, where $\sigma^2$ is the noise variance.

For a given bit location, the corresponding LLR is:

$$LLR(b)=\ln(Pr\{b=0|x\}/Pr\{b=1|x\}).$$

If bits are duplicated at the transmitter (e.g., in accordance with repetition encoding), the receiver may process these bits by summing the LLRs and then duplicating the sum.

$$LLR\_mod(b(k))=LLR\_mod(b(k+N))=LLR(b(k))+LLR(b(k+N))$$

In other words, chase combining may be performed to make each of the LLRs associated with the bit locations in each of the original and duplicate bit locations (e.g., in $b_2$ and $\overline{b_2}$) of the transmitted sequence after performing the summing/chase combining describe above.

In addition, scaling may also be performed of the resulting LLR values for each bit, such as may be desired in accordance with normalization.

There are a variety of types of decoders that may be employed herein to operate on the LLRs (which are input to the decoder as soft information). One type of decoder is produces soft output information (e.g., being a soft in/soft out (SISO) type decoder). Another type of decoder is produces hard output information (e.g., hard decisions).

Also, it is noted that if the decoder is not an iterative decoder, then the LLRs for the two blocks of input information bits (i.e., the original block and its duplicate in accordance with repetition encoding) are summed (chase combined) before decoding.

These bit estimates corresponding to the information included within the header of a frame, and include all of the information to make the data portion of the frame self-describing. Once the header information is extracted from the frame, it is used with regards to block decoding of the data portion of the frame.

Figure 10:
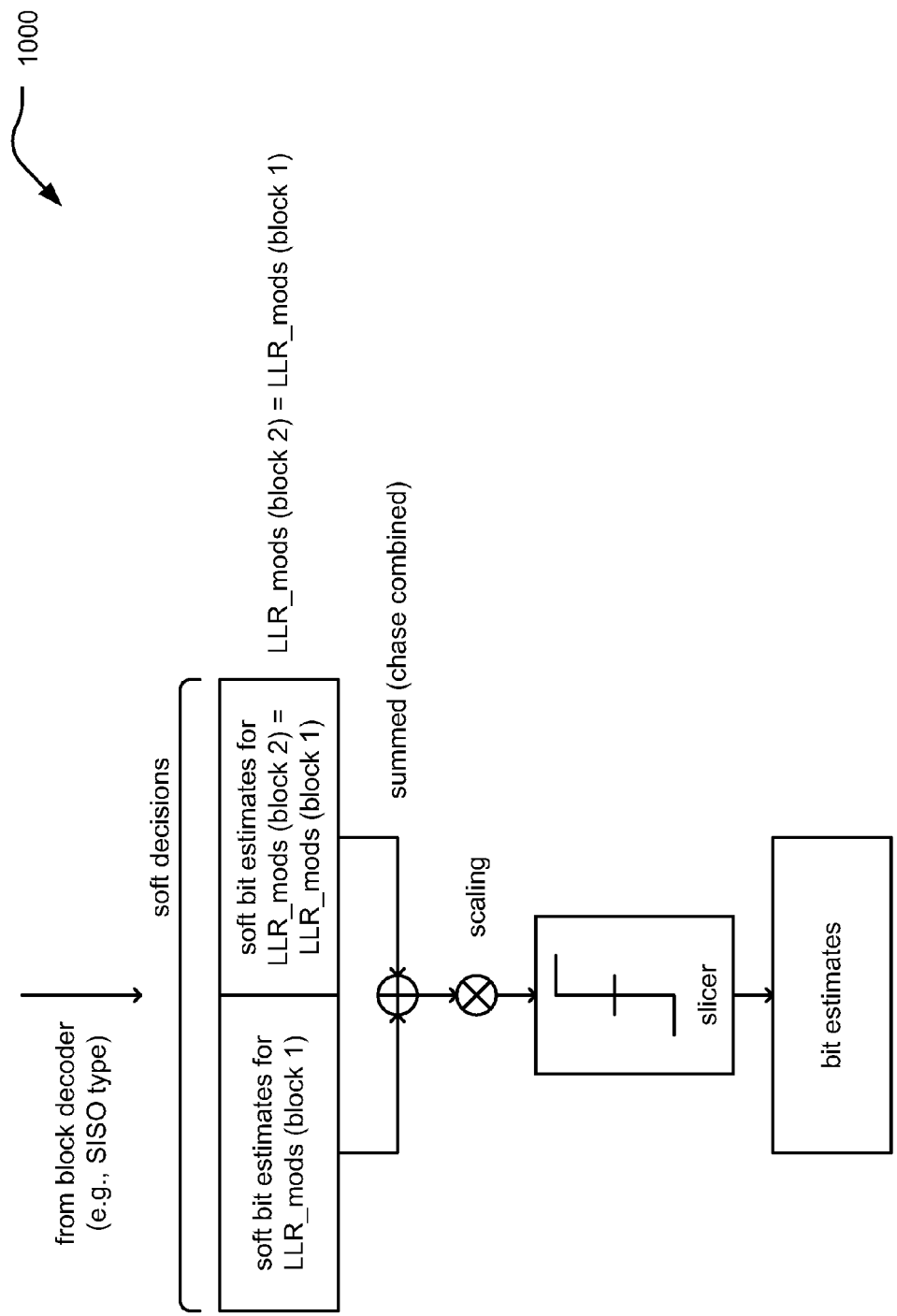
FIG. 10 illustrates an embodiment of chase combining of soft information generated by a decoder that produces such soft information.

FIG. 10 illustrates an embodiment 1000 of chase combining of soft information generated by a decoder that produces such soft information. If the output from the block code decoder is a soft output (i.e., more than 1 bit is output per bit position), then the two sets of soft bits estimates for the modified LLRs are summed (chase combined again) before a bit decision is made such as within a slicer to generate the final bit estimates. Also, scaling may also be performed (e.g., such as in accordance with normalization) on the chase combined soft bit estimates before hard decisions are made such as within a slicer.

Figure 11:
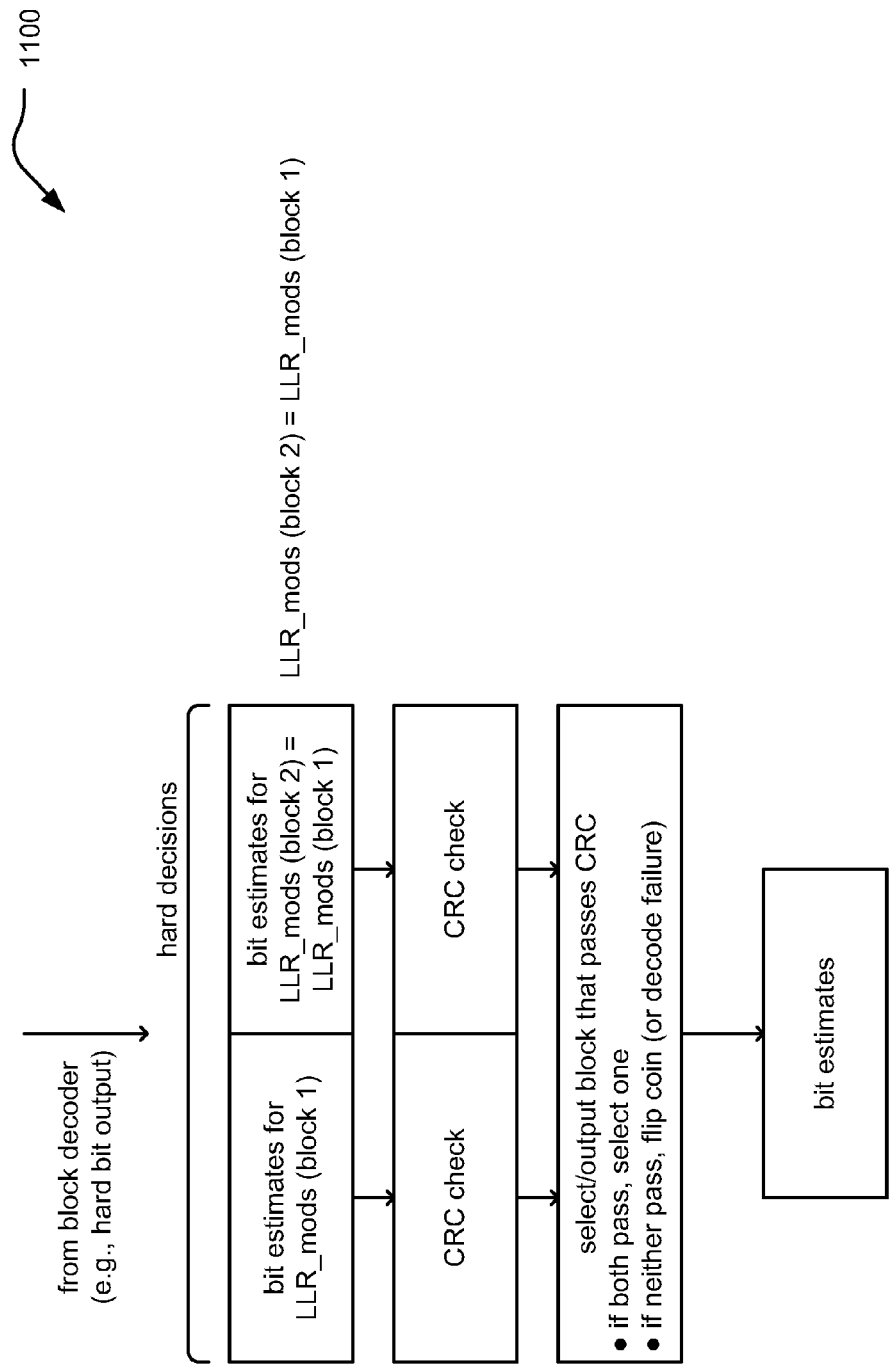
FIG. 11 illustrates an embodiment of processing of hard information generated by a decoder that produces such hard information.

FIG. 11 illustrates an embodiment 1100 of processing of hard information generated by a decoder that produces such hard information. If the output from the block code decoder is a hard (bit) output, and there is a parity or cyclic redundancy check embedded in the data, both blocks (i.e., the original block and its duplicate in accordance with repetition encoding) are checked (such as in accordance with cyclic redundancy check (CRC) encoding/decoding) and the block that passes the check (e.g., CRC) is selected for output. If both of the blocks pass the check (e.g., CRC), then either one of them may be output. However, if neither of the blocks pass the check (e.g., CRC), then a coin flip may be performed and the winner may be output. Alternatively, a decoding failure notification may be made and a re-send of the transmission may be requested.

Figure 12:
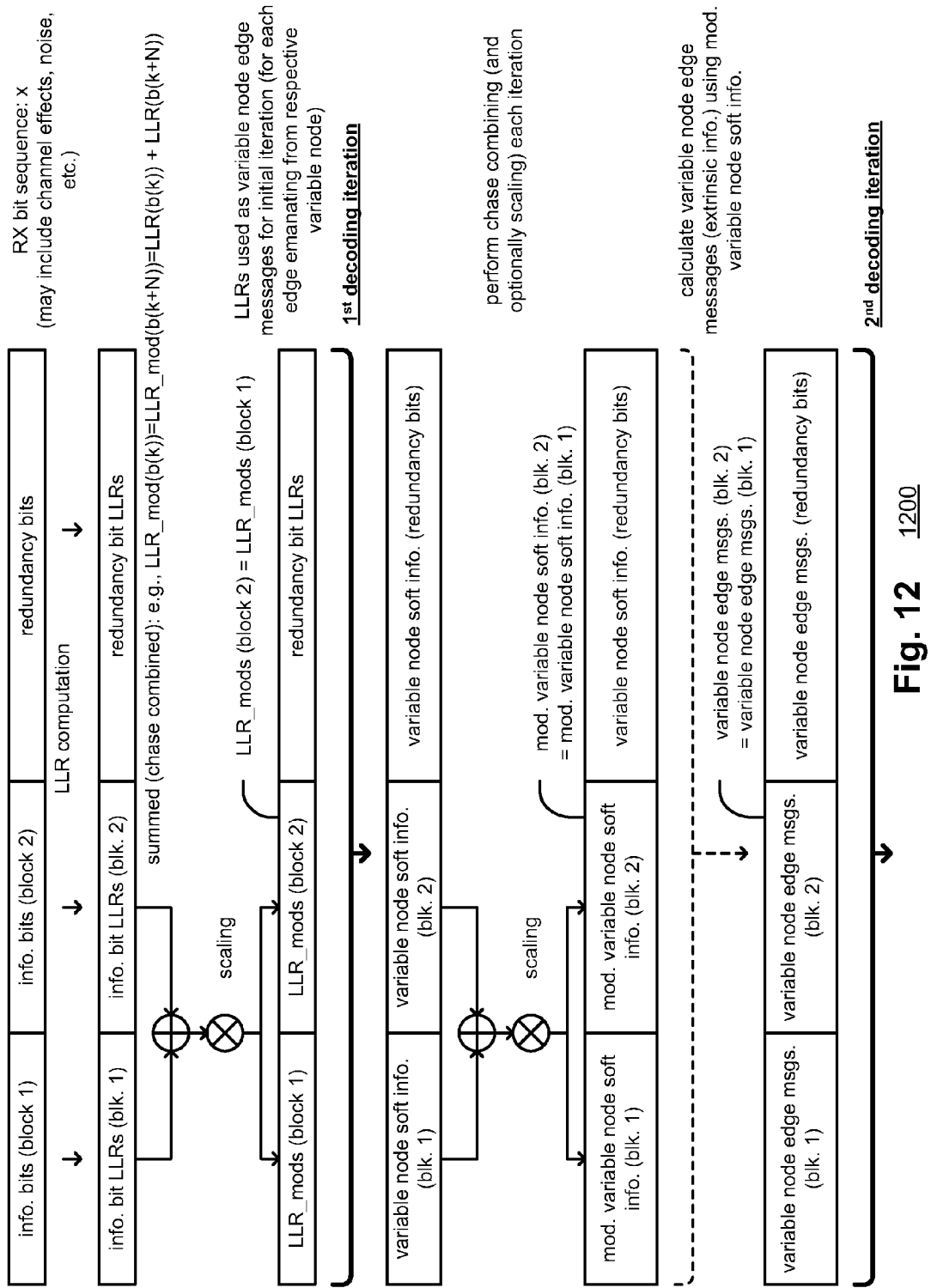
FIG. 12 illustrates an embodiment of LDPC decoding processing that performs chase combining of variable node soft information during each of the decoding iterations.

FIG. 12 illustrates an embodiment 1200 of LDPC decoding processing that performs chase combining of variable node soft information during each of the decoding iterations. It is noted that if the decoder being employed in a particular emboss is an iterative decoder, chase combining may be performed during each decoding iteration.

For example, considering an LDPC decoder, the two blocks of input LLRs (i.e., corresponding to the original block and its duplicate in accordance with repetition encoding) are summed (chase combined) as described previously. Then, after every iteration, the two sets of variable node messages corresponding to the two identical blocks of input bits are summed before variable node edge message (extrinsic message) passing edge information are generated.

$q_{ij}=q_{(i+N)j}=(q_{ij}+q_{(i+N)j})/2$, $i=1 \ldots 2\times N$, where $q_{ij}$ is the message sent from variable node $c_i$ to check node $f_j$.

$q_{ij}$ indicates the belief (at the current iteration) that the bit at position i is a 0 or a 1.

A signal received from a communication channel undergoes appropriate demodulation (e.g., processing within an analog front end including digital sampling, filtering, gain adjustment, etc.) to generate a received bit sequence. Then, LLRs are calculated for each bit location within the received bit sequence.

The bit locations corresponding to the original block and its duplicate in accordance with repetition encoding undergo chase combining and optional scaling (e.g., with respect to normalization) to generate the LLRs for the bit locations of the original block and its duplicate.

These LLRs as employed as the variable node edge messages for an initial LDPC decoding iteration. The variable node edge messages, for each edge emanating from each respective variable node, are assigned to be the same value as the LLR of that respective variable node for the initial LDPC decoding iteration.

A first decoding iteration is performed (i.e., check node processing/updating and bit node processing/updating) to generate variable node soft information. This updated variable node soft information may then undergo chase combining and optional scaling intra-iteration (i.e., within a decoding iteration) thereby generating modified variable node soft information. These appropriately chase combined and optional scaled, modified variable node soft information values then are employed to calculate updated variable node edge messages (extrinsic information).

A second decoding iteration is performed (i.e., check node processing/updating and bit node processing/updating) to generate next updated variable node soft information.

As mentioned above, the LLRs of any bit encoded in accordance with a BPSK modulation (or alternatively referred to as a $\pi/2$-BPSK) given a soft equalizer output x and AWGN impairment is $2*x/\sigma^2$, where $\sigma^2$ is the noise variance.

For a given bit location, the corresponding LLR is:

$$LLR(b)=\ln(Pr\{b=0|x\}/Pr\{b=1|x\}).$$

However, when the one-time pad processing described herein is employed, and a bit is flipped, then this must be dealt with and handled appropriately at the receiver.

If a bit is "flipped" by XOR processing in accordance with the one-time pad processing, the LLR is therefore negated before it is chase combined (and optionally scaled) at the input to the block code decoder. This negation of the "flipping" by XOR processing in accordance with the one-time pad processing may be performed in accordance with BPSK modulation (or alternatively referred to as a $\pi/2$-BPSK) as follows:

$$LLR\_mod(b(k))=LLR\_mod(b(k+N))= LLR(b(k))+(-1)^{c(k)}\times LLR(b(k+N))$$

Clearly, appropriate negation of such "flipping" by XOR processing in accordance with the one-time pad processing may be performed in accordance with other types of modulations (e.g., QPSK, 8-PSK, 16 QAM, 32 APSK, etc.).

Figures 13A, 13B:
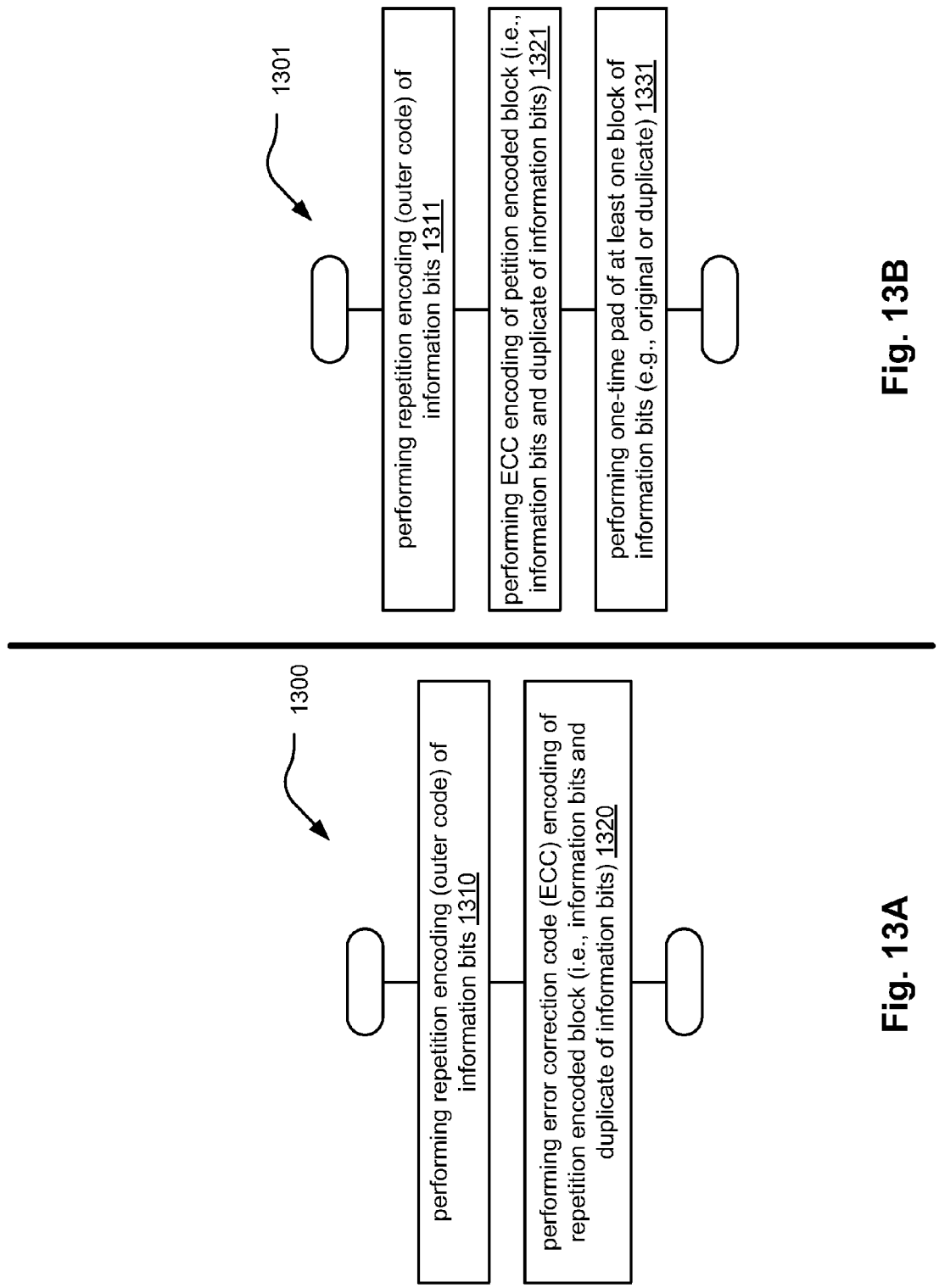
FIG. 13A illustrates an embodiment of a method for performing repetition encoding.
FIG. 13B illustrates an embodiment of a method for performing repetition encoding in conjunction with error correction code (ECC) encoding.

FIG. 13A illustrates an embodiment of a method for performing repetition encoding.

Referring to method 1300 of FIG. 13A, the method 1300 begins by performing repetition encoding (outer code) of information bits, as shown in a block 1310. The method 1300 continues by performing error correction code (ECC) encoding of repetition encoded block (i.e., information bits and duplicate of information bits), as shown in a block 1320.

FIG. 13B illustrates an embodiment of a method for performing repetition encoding in conjunction with error correction code (ECC) encoding.

Referring to method 1301 of FIG. 13B, the method 1301 begins by performing repetition encoding (outer code) of information bits, as shown in a block 1311. The method 1301 then operates by performing ECC encoding of petition encoded block (i.e., information bits and duplicate of information bits), as shown in a block 1321. The method 1301 continues by performing one-time pad of at least one block of information bits (e.g., original or duplicate), as shown in a block 1331.

Figure 14:
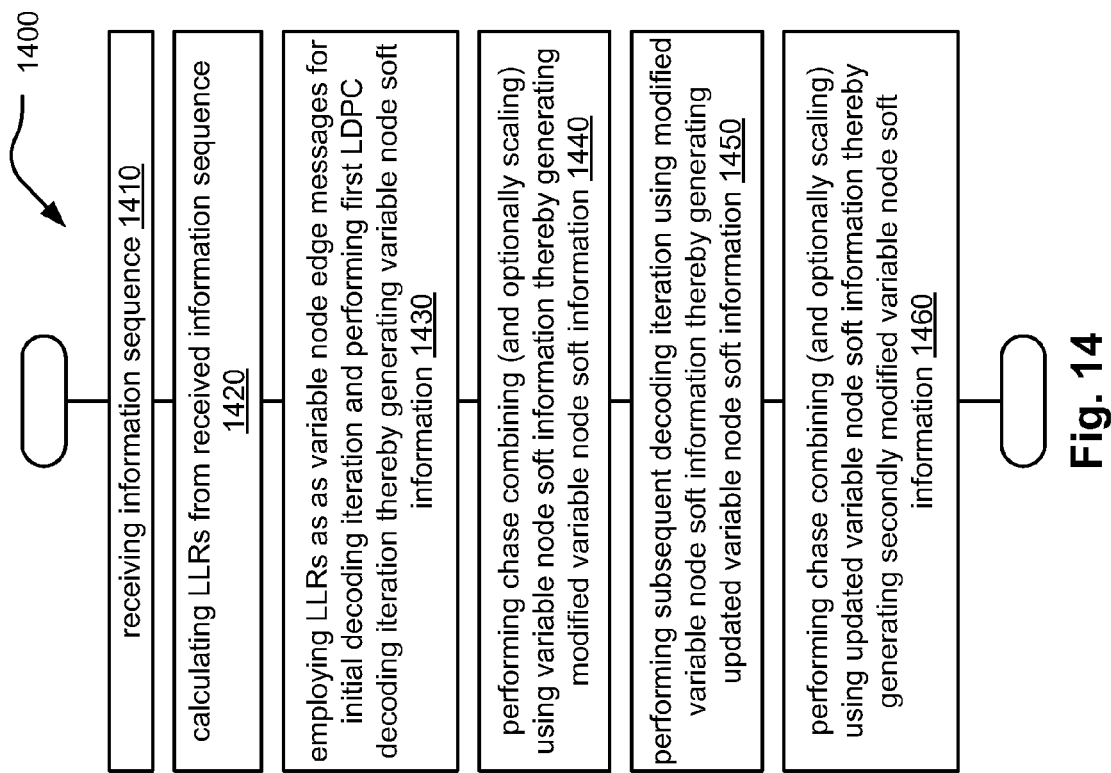
FIG. 14 illustrates an embodiment of a method for LDPC decoding processing that performs chase combining of variable node soft information during each of the decoding iterations.

FIG. 14 illustrates an embodiment of a method 1400 for LDPC decoding processing that performs chase combining of variable node soft information during each of the decoding iterations. Referring to method 1400 of FIG. 14, the method 1400 begins by receiving information sequence, as shown in a block 1410.

The method 1400 continues by calculating LLRs from received information sequence, as shown in a block 1420. The method 1400 then operates by employing LLRs as variable node edge messages for initial decoding iteration and performing first LDPC decoding iteration thereby generating variable node soft information, as shown in a block 1430.

The method 1400 continues by performing chase combining (and optionally scaling) using variable node soft information thereby generating modified variable node soft information, as shown in a block 1440. The method 1400 continues by performing subsequent decoding iteration using modified variable node soft information thereby generating updated variable node soft information, as shown in a block 1450.

The method 1400 continues by performing chase combining (and optionally scaling) using updated variable node soft information thereby generating secondly modified variable node soft information, as shown in a block 1460.

It is noted that the various modules (e.g., encoding modules, decoding modules, etc.) described herein may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a log-likelihood ratio (LLR) circuitry that is operative to calculate a plurality of LLRs corresponding to each respective bit location of a received bit sequence;
an LDPC (Low Density Parity Check) decoder circuitry that is operative to:
employ the plurality of LLRs as a first plurality of variable node edge messages in accordance with a first decoding iteration to generate a first plurality of variable node soft information values;
perform chase combining of a first subset of the first plurality of variable node soft information values with a second subset of the first plurality of variable node soft information values thereby generating a modified first plurality of variable node soft information values;
employ the modified first plurality of variable node soft information values to calculate a second plurality of variable node edge messages;
employ the second plurality of variable node edge messages in accordance with a second decoding iteration to generate a second plurality of variable node soft information values; and
perform chase combining of a first subset of the second plurality of variable node soft information values with a second subset of the second plurality of variable node soft information values thereby generating a modified second plurality of variable node soft information values; and a hard limiter that is operative to employ the modified second plurality of variable node soft information values to make bit estimates corresponding to the received bit sequence.

2. The apparatus of claim 1, wherein the LDPC decoder circuitry further comprises a scaling module:

during the first decoding iteration, the scaling module of the LDPC decoder circuitry is operative to scale the modified first plurality of variable node soft information values; and during the second decoding iteration, the scaling module of the LDPC decoder circuitry is operative to scale the modified second plurality of variable node soft information values.

3. The apparatus of claim 2, wherein:

the scaling the modified first plurality of variable node soft information values is operative to normalize the modified first plurality of variable node soft information values; and the scaling the modified second plurality of variable node soft information values is operative to normalize the modified second plurality of variable node soft information values.

4. The apparatus of claim 1, wherein the LDPC decoder circuitry is operative to:

sum the first subset of the first plurality of variable node soft information values with the second subset of the first plurality of variable node soft information values thereby generating a modified first plurality of variable node soft information values; and sum the first subset of the second plurality of variable node soft information values with the second subset of the second plurality of variable node soft information values thereby generating a modified second plurality of variable node soft information values.

5. The apparatus of claim 1, wherein:

the received bit sequence includes a plurality of information bits, a duplicate of the plurality of information bits, and a plurality of redundancy bits; and the LLR circuitry is operative to perform chase combining of those LLRs of the plurality of LLRs corresponding to the plurality of information bits with those LLRs of the plurality of LLRs corresponding to the duplicate of the plurality of information bits thereby generating a modified plurality of LLRs that corresponds to the respective bit locations in each of the plurality of information bits and the duplicate of the plurality of information bits.

6. The apparatus of claim 1, further comprising:

a cyclic redundancy check (CRC) circuitry that is operative to process the bit estimates to determine if the bit estimates pass CRC; and wherein:

the received bit sequence includes a plurality of information bits, a duplicate of the plurality of information bits, and a plurality of redundancy bits; and if the bit estimates corresponding to the respective bit locations in each of the plurality of information bits and the duplicate of the plurality of information bits pass CRC, then the CRC circuitry is operative to output one of the bit estimates corresponding to the respective bit locations in the plurality of information bits and the estimates corresponding to the duplicate of the plurality of information bits; and if neither the bit estimates corresponding to the respective bit locations of the plurality of information bits nor the duplicate of the plurality of information bits pass CRC, then the CRC circuitry indicates decoding failure and the apparatus is operative to request a re-transmission of the received bit sequence from at least one additional apparatus from which the received bit sequence was sent.

7. The apparatus of claim 1, wherein:

the received bit sequence is a header of a frame that includes the header and data; and the bit estimates includes a plurality of information corresponding to the frame or data including frame length, a code type by which the data are encoded, a code rate by which the data are encoded, and a modulation by which symbols of the data are modulated.

8. The apparatus of claim 7, further comprising:

a block decoder circuitry that is operative to decode the data of the frame based on the plurality of information corresponding to the frame or data to make bit estimates corresponding to the data of the frame.

9. The apparatus of claim 8, wherein:

the block decoder circuitry is a Reed-Solomon (RS) decoder circuitry, at least one additional LDPC decoder circuitry, a turbo code decoder circuitry, or a Turbo Trellis Coded Modulation (TTCM) decoder circuitry.

10. The apparatus of claim 1, wherein:

the apparatus is a communication device; and the communication device is implemented within at least one of a satellite communication system, a wireless communication system, a wired communication system, and a fiber-optic communication system.

11. An apparatus, comprising:

a log-likelihood ratio (LLR) circuitry that is operative to calculate a plurality of LLRs corresponding to each respective bit location of a received bit sequence;

an LDPC (Low Density Parity Check) decoder circuitry that is operative to:

employ the plurality of LLRs as a first plurality of variable node edge messages in accordance with a first decoding iteration to generate a first plurality of variable node soft information values;

perform chase combining of a first subset of the first plurality of variable node soft information values with a second subset of the first plurality of variable node soft information values thereby generating a modified first plurality of variable node soft information values;

normalize the modified first plurality of variable node soft information values thereby generating a normalized, modified first plurality of variable node soft information values;

employ the normalized, modified first plurality of variable node soft information values; to calculate a second plurality of variable node edge messages;

employ the second plurality of variable node edge messages in accordance with a second decoding iteration to generate a second plurality of variable node soft information values;

perform chase combining of a first subset of the second plurality of variable node soft information values with a second subset of the second plurality of variable node soft information values thereby generating a modified second plurality of variable node soft information values; and normalize the modified second plurality of variable node soft information values thereby generating a normalized, modified second plurality of variable node soft information values; and a hard limiter that is operative to employ the normalized, modified second plurality of variable node soft information values to make bit estimates corresponding to the received bit sequence; and wherein:

the received bit sequence is a header of a frame that includes the header and data; and the bit estimates includes a plurality of information corresponding to the frame or data including frame length, a code type by which the data are encoded, a code rate by which the data are encoded, and a modulation by which symbols of the data are modulated.

12. The apparatus of claim 11, wherein:

the received bit sequence includes a plurality of information bits, a duplicate of the plurality of information bits, and a plurality of redundancy bits; and the LLR circuitry is operative to perform chase combining of those LLRs of the plurality of LLRs corresponding to the plurality of information bits with those LLRs of the plurality of LLRs corresponding to the duplicate of the plurality of information bits thereby generating a modified plurality of LLRs that corresponds to the respective bit locations in each of the plurality of information bits and the duplicate of the plurality of information bits.

13. The apparatus of claim 11, further comprising:

a cyclic redundancy check (CRC) circuitry that is operative to process the bit estimates to determine if the bit estimates pass CRC; and wherein:

the received bit sequence includes a plurality of information bits, a duplicate of the plurality of information bits, and a plurality of redundancy bits; and if the bit estimates corresponding to the respective bit locations in each of the plurality of information bits and the duplicate of the plurality of information bits pass CRC, then the CRC circuitry is operative to output one of the bit estimates corresponding to the respective bit locations in the plurality of information bits and the estimates corresponding to the duplicate of the plurality of information bits; and if neither the bit estimates corresponding to the respective bit locations in each of the plurality of information bits nor the duplicate of the plurality of information bits pass CRC, then the CRC circuitry indicates decoding failure and the apparatus is operative to request a re-transmission of the received bit sequence from at least one additional apparatus from which the received bit sequence was sent.

14. The apparatus of claim 11, further comprising:

a block decoder circuitry that is operative to decode the data of the frame based on the plurality of information corresponding to the frame or data to make bit estimates corresponding to the data of the frame.

15. The apparatus of claim 14, wherein:

the block decoder circuitry is a Reed-Solomon (RS) decoder circuitry, at least one additional LDPC decoder circuitry, a turbo code decoder circuitry, or a Turbo Trellis Coded Modulation (TTCM) decoder circuitry.

16. The apparatus of claim 11, wherein:

the apparatus is a communication device; and the communication device is implemented within at least one of a satellite communication system, a wireless communication system, a wired communication system, and a fiber-optic communication system.

17. A method, comprising:

calculating a plurality of LLRs corresponding to each respective bit location of a received bit sequence;

operating an LDPC (Low Density Parity Check) decoder circuitry to:

employ the plurality of LLRs as a first plurality of variable node edge messages in accordance with a first decoding iteration to generate a first plurality of variable node soft information values;

perform chase combining of a first subset of the first plurality of variable node soft information values with a second subset of the first plurality of variable node soft information values thereby generating a modified first plurality of variable node soft information values;

employ the modified first plurality of variable node soft information values to calculate a second plurality of variable node edge messages;

employ the second plurality of variable node edge messages in accordance with a second decoding iteration to generate a second plurality of variable node soft information values; and perform chase combining of a first subset of the second plurality of variable node soft information values with a second subset of the second plurality of variable node soft information values thereby generating a modified second plurality of variable node soft information values; and hard limiting the modified second plurality of variable node soft information values to make bit estimates corresponding to the received bit sequence.

18. The method of claim 17, further comprising:

during the first decoding iteration, operating the LDPC decoder circuitry to scale the modified first plurality of variable node soft information values; and during the second decoding iteration, operating the LDPC decoder circuitry to scale the modified second plurality of variable node soft information values.

19. The method of claim 17, wherein:

the received bit sequence is a header of a frame that includes the header and data; and the bit estimates includes a plurality of information corresponding to the frame or data including frame length, a code type by which the data are encoded, a code rate by which the data are encoded, and a modulation by which symbols of the data are modulated; and further comprising:

decoding the data of the frame based on the plurality of information corresponding to the frame or data to make bit estimates corresponding to the data of the frame.

20. The method of claim 17, wherein:

the method is performed within a communication device; and the communication device is implemented within at least one of a satellite communication system, a wireless communication system, a wired communication system, and a fiber-optic communication system.

* * * * *